United States Patent
Nelson et al.

(10) Patent No.: US 6,829,148 B2
(45) Date of Patent: Dec. 7, 2004

(54) APPARATUS AND METHOD FOR PROVIDING A GROUND REFERENCE POTENTIAL

(75) Inventors: David A. Nelson, Olathe, KS (US);
Tuan N. Nguyen, Olathe, KS (US);
Chris L. Joseph, Olathe, KS (US);
Glen M. Whiting, Overland Park, KS (US)

(73) Assignee: Honeywell International Inc., Morristown, NJ (US)

( * ) Notice: Subject to any disclaimer, the term of this patent is extended or adjusted under 35 U.S.C. 154(b) by 9 days.

(21) Appl. No.: 10/179,552

(22) Filed: Jun. 24, 2002

(65) Prior Publication Data

US 2003/0051340 A1 Mar. 20, 2003

Related U.S. Application Data

(60) Provisional application No. 60/323,024, filed on Sep. 14, 2001.

(51) Int. Cl.[7] .............................. H05K 7/02; H05K 7/06; H05K 7/08; H05K 7/10
(52) U.S. Cl. ........................................ 361/760; 361/816
(58) Field of Search ................................ 361/760–761, 361/816, 818, 799–800, 792–794, 780–784; 174/35 R, 51, 35 MS; 333/12, 246

(56) References Cited

U.S. PATENT DOCUMENTS

| | | | | |
|---|---|---|---|---|
| 3,656,160 A | * | 4/1972 | Burton | ........................ 343/702 |
| 4,214,360 A | * | 7/1980 | Tuma et al. | ................... 29/829 |
| 4,833,276 A | * | 5/1989 | Ito | ............................ 174/35 R |
| 4,904,968 A | * | 2/1990 | Theus | ........................ 333/246 |
| 5,045,973 A | * | 9/1991 | Saarela et al. | ............... 361/814 |
| 5,171,936 A | * | 12/1992 | Suzuki et al. | ........... 174/35 MS |
| 5,239,127 A | * | 8/1993 | Swikle et al. | .............. 174/35 R |
| 5,598,169 A | * | 1/1997 | Drabeck et al. | ............. 343/701 |
| 5,719,750 A | * | 2/1998 | Iwane | ......................... 361/794 |

* cited by examiner

Primary Examiner—David Zarneke
Assistant Examiner—Tuan Dinh

(57) ABSTRACT

A circuit on a printed circuit board transmits radio frequency (RF) signals. A modulator operatively coupled to the printed circuit board modulates a signal to be transmitted by modulating an information signal onto a carrier signal. A ground plane attaches to edges and to first and second surfaces of the printed circuit board. The ground plane electrically connects to components of the modulator. A power transistor physically attaches to the printed circuit board and electrically connects to the ground plane through a slot in the printed circuit board. The ground plane provides a suitable ground reference potential for both the modulator and the power transistor without individually constructed circuit boards for each. A ground isolation barrier formed on the ground plane may prevent "cross talk" between the modulator and the power transistor.

15 Claims, 4 Drawing Sheets

APPARATUS AND METHOD FOR PROVIDING A GROUND REFERENCE POTENTIAL

RELATED APPLICATIONS

This application claims benefit to provisional application Ser. No. 60/323,024, filed Sep. 14, 2001 and is hereby incorporated by reference to the extent as though fully replicated herein.

BACKGROUND OF THE INVENTION

Radio Frequency (RF) transmitters are used to transmit RF signals. The RF signals can convey many types of information, such as digital and analog communications and radio direction and ranging (RADAR) information. Many examples of uses for RF transmitters are found in aircraft. One such example of an RF transmitter is that of an Aviation Collision Avoidance System.

The RF transmitter used in the Aviation Collision Avoidance System typically includes a transmitter circuit and a modulator circuit. The transmitter circuit and the modulator circuit are each typically developed on individual printed circuit boards (PCB). The printed circuit board used by the modulator circuit, or modulator circuit board, may have a ground plane attached to a surface of the printed circuit board for providing a ground reference potential to certain components of the modulator circuit. The printed circuit board used by the transmitter circuit, or transmitter circuit board, is connected to a metal chassis that encases the transmitter. The metal chassis provides a ground reference potential to certain components of the transmitter circuit. The transmitter circuit includes a power transistor that supplies power to certain components of the transistor circuit. A base of the power transistor is electrically connected to the chassis. The power transistor is either laminated or "vapor-phased" with a corrosion inhibitor. The laminate isolates the ground reference potential from certain components of the transmitter circuit board. Ground isolation prevents "cross-talk" between components of the transmitter and the power transistor. The laminate also provides corrosion protection to the transmitter circuit board.

Separating a modulator circuit board from a transmitter circuit board increases design complexity. However, the ground reference potential supplied by the metal chassis is necessary to improve output power of the power transistor and prevent "frequency-pulling" of the transmitted signal. "Frequency-pulling" is an unintentional alteration of a transmitted signal at the transmitter end of a communication link. The unintentional alteration of the transmitted signal degrades reception capabilities at a receiver end of the communication link. Present grounding techniques cannot offer a combined transmitter-modulator circuit board that supplies a ground reference potential for preventing "frequency-pulling" of the transmitted signal. Moreover, the present grounding techniques of the combined transmitter modulator circuit board degrade output power for the transmitter circuit, thereby decreasing strength and, thus, reception capabilities of the transmitted signal.

Transmitters are often essential to safety, particularly when used in aviation systems. Transmitters used in the Aviation Collision Avoidance Systems ensure that aircraft do not collide with one another by transmitting proximity information to the aircraft. The proximity information includes details about aircraft in an area, such as location, altitude, and speed of nearby aircraft. Proper transmission of the proximity information assists in reception of the proximity information. Poor or missed receptions of the proximity information can result in catastrophic events.

The invention provides certain features to advance the state of the art by providing, among other features, a circuit for transmitting RF signals that supplies a ground reference potential to a transmitter component and a modulator component. Other features will be apparent in the description that follows.

SUMMARY OF THE INVENTION

In one aspect, the invention provides a circuit on a printed circuit board for transmitting radio frequency (RF) signals. A modulator operatively coupled to the printed circuit board modulates a signal to be transmitted by modulating an information signal onto a carrier signal. A ground plane attaches to edges and to first and second surfaces of the printed circuit board. The ground plane electrically connects to components of the modulator. A power transistor physically attaches to the printed circuit board and electrically connects to the ground plane through a slot in the printed circuit board. The ground plane provides a suitable ground reference potential for both the modulator and the power transistor without individually constructed circuit boards for each. A ground isolation barrier formed with the ground plane may prevent "cross talk" between the modulator and the power transistor. The ground isolation barrier may prevent unintentional connection to the ground plane by other components that may be attached to the printed circuit board.

In another aspect, the modulator electrically connects to the ground plane through vias of the printed circuit board. A metal connector may physically connect the power transistor to the printed circuit board through the slot in the printed circuit board. The metal connector may contact the ground plane to electrically connect the power transistor to the ground plane such that the power transistor receives the ground reference potential. A grounding strap may attach to the metal connector and electrically connect to the ground plane. A heat sink may attach to the ground plane with the metal connector to dissipate heat from the circuit.

The circuit provides an improved ground reference potential to the power transistor, which can improve the gain of a transmitted signal. The circuit also increases frequency stability of the transmitted signal by decreasing external inductance to the power transistor.

BRIEF DESCRIPTION OF THE DRAWINGS

A more complete understanding of the invention may be obtained by reference to the drawings, in which.

DETAILED DESCRIPTION OF THE DRAWINGS

Figure 1:
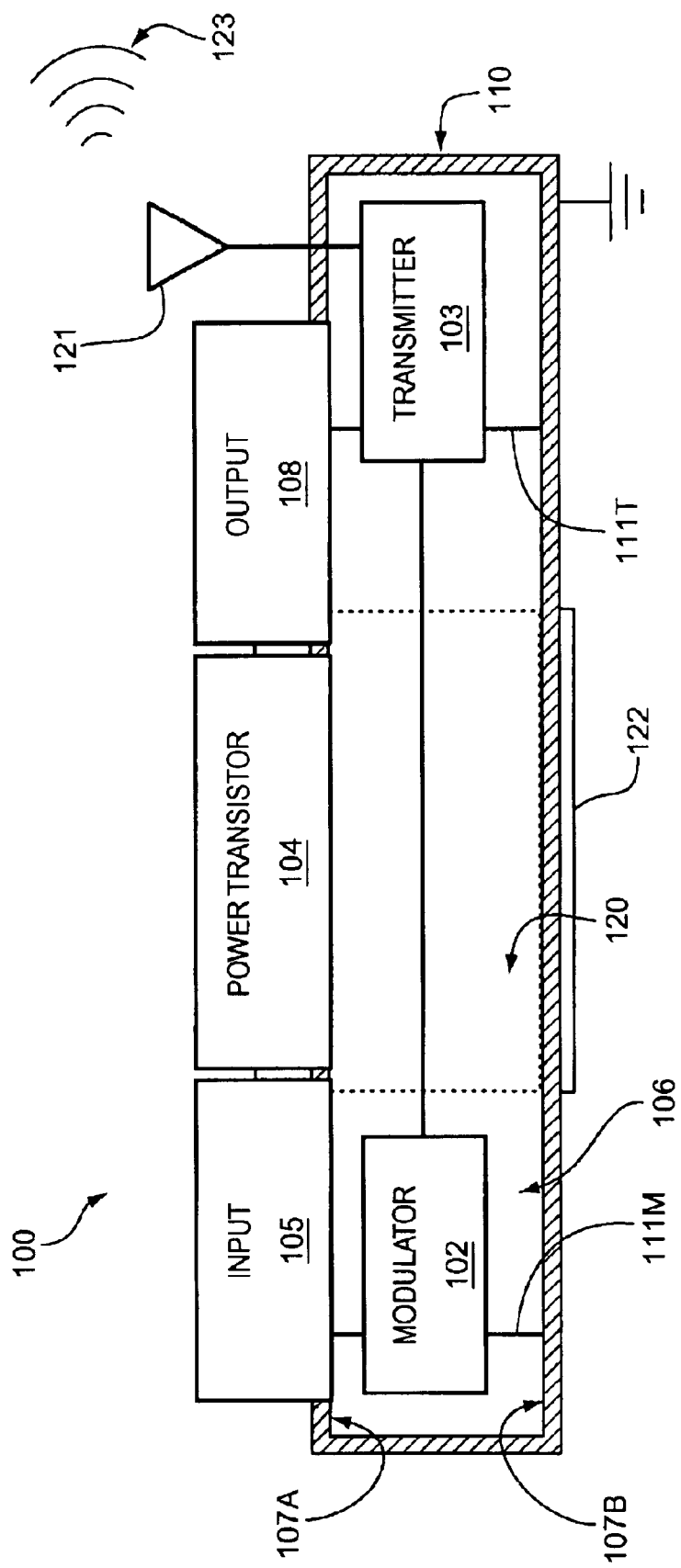
FIG. 1 shows a block diagram of one circuit in accord with one embodiment of the invention.

FIG. 1 shows circuit 100 for transmitting radio frequency (RF) signals. Circuit 100 includes modulator 102 operatively coupled to printed circuit board 106. Circuit 100 also includes transmitter 103 operatively coupled to printed circuit board 106. Ground plane 110 is physically attached to edges and to first and second surfaces 107A and 107B, respectively, of printed circuit board 106. Modulator 102 and transmitter 103 may be operatively coupled to each other for forming and transmitting RF signal 123. Input matching network 105, output matching network 108, and power transistor 104 may be operatively coupled to printed circuit board 106. Ground plane 110 is electrically connected to modulator 102 for supplying a ground reference potential to modulator 102, thereby forming electrical connection 111M. Ground plane 110 is also electrically connected to transmitter 103 for supplying a ground reference potential, thereby forming electrical connection 111T. Ground isolation barrier 122 is formed on ground plane 110 adjacent to second surface 107B of printed circuit board 106. Ground isolation barrier 122 may prevent "cross-talk" between components of modulator 102, transmitter 103 and power transistor 104, as illustrated by region 120. Power transistor 104 is electrically connected to ground plane 110 for receiving a ground reference potential. An "electrical connection" as used herein may, for example, include a wire and/or a solder bond for conducting electricity Power transistor 104 may be used for supplying power to transmitter 103. Modulator 102 is electrically connected to power transistor 104 through input matching network 105. Transmitter 103 is electrically connected to power transistor 104 through output matching network 108. Transmitter 103 may be configured for transmitting RF signal 123 through antenna 121. An example of transmitter 103 may include a KT70 transponder transmitter module produced by Honeywell, Incorporated. Modulator 102 may be configured for modulating an information signal onto an RF carrier signal. Printed circuit board 106 may include a multilayer composite board.

Figure 2:
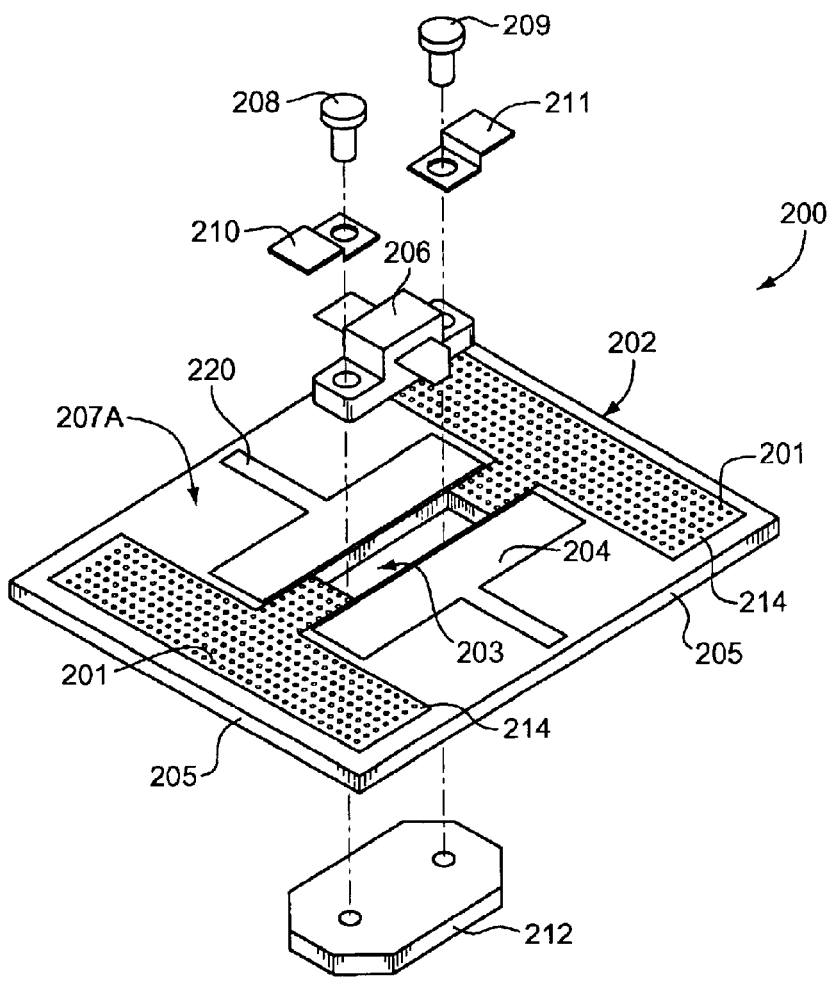
FIG. 2 shows an assembly view of one circuit, in accord with one embodiment of the invention.

FIG. 2 shows an assembly view of circuit 200, in accord with one embodiment of the invention. Circuit 200 includes printed circuit board 202. Printed circuit board 202 includes output matching network 204 on first surface 207A of printed circuit board 202, for connecting circuitry, such as a transmitter, of printed circuit board 202 to power transistor 206. Printed circuit board 202 also includes input matching network 220 on first surface 207A of printed circuit board 202, for connecting circuitry, such as a modulator, of printed circuit board 202 to power transistor 206. Power transistor 206 is physically attached to printed circuit board 202 by physical connectors 208 and 209. Printed circuit board 202 may have vias 201 for electrically connecting circuitry to ground plane 214. Vias 201 may function as conduction paths that allow electrical conduction to a circuitry of printed circuit board 202. Examples of such circuitry include the transmitter and the modulator discussed in FIG. 6.

Physical connectors 208 and 209 respectively attach to grounding straps 210 and 211. Physical connectors 208 and 209 may be metal screws, metal pins, or other fastening devices capable of conducting electricity. Grounding straps 210 and 211 physically contact ground plane 214 to provide an electrical connection. In one example, grounding strap 210 is formed as a metal tab with a hole such that physical connector 208 is inserted. Physical connector 210 and grounding strap 211 may function similarly. Grounding straps 210 and 211 may be formed of a material capable of conducting electricity. Printed circuit board 202 may either have holes or slot 203 such that physical connectors 208 and 209 are inserted. Physical connectors 208 and 209 may fasten to heat sink 212 on second surface 207B of printed circuit board 202 (second surface 207B is, for example, viewable in FIG. 4). Heat sink 212 may be constructed of a metal such as copper to dissipate heat from circuit 200.

Figure 3:
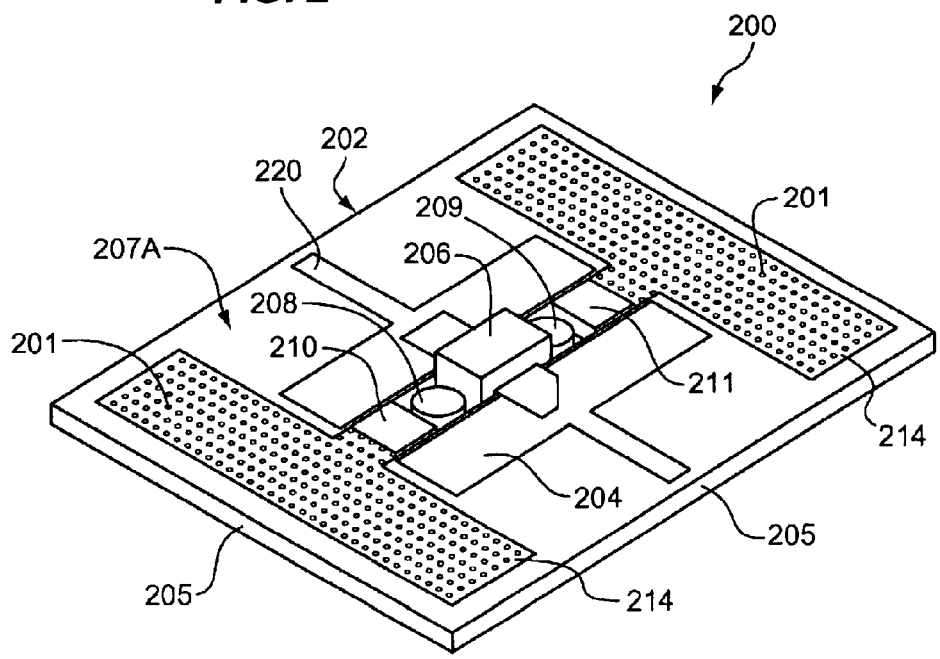
FIG. 3 shows one assembled view of one circuit, in accord with one embodiment of the invention.
Figure 4:
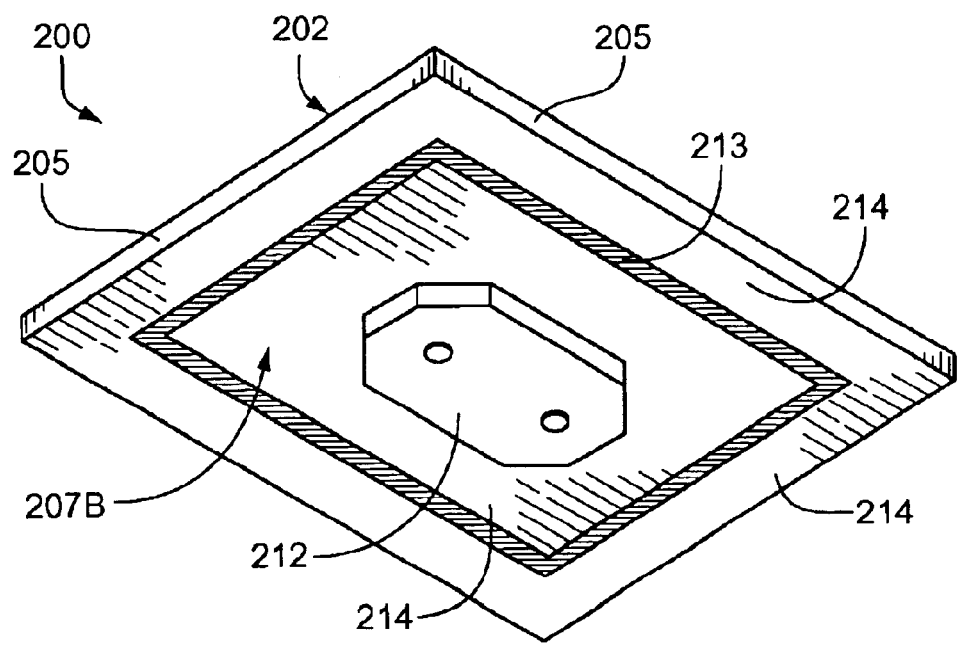
FIG. 4 shows one other assembled view of one circuit, in accord with one embodiment of the invention.

FIGS. 3 and 4 show an assembled view of circuit 200, in accord with one embodiment of the invention. Physical connectors 208 and 209 may respectively fasten grounding straps 210 and 211 to power transistor 206. Physical connectors 208 and 209 may pass through printed circuit board 202 and connect with heat sink 212. Ground plane 214 may be physically attached to edges 205 and first and second surfaces, 207A and 207B, respectively, of printed circuit board 202 for providing a ground reference potential. Circuitry of printed circuit board 202 may electrically connect to ground plane 214 through vias 201 that traverse through printed circuit board 202. Circuitry of printed circuit board 202 may also electrically connect to power transistor 206 through input matching network 220 and output matching network 204. Heat sink 212 may be soldered to ground plane 214 on second surface 207B of printed circuit board 202. Heat sink 212 may be additionally attached to ground plane 214 with physical connectors 208 and 209. Ground isolation barrier 213 may be formed on second surface 207B of printed circuit board 202 for preventing "cross-talk" between components of circuitry of printed circuit board 202 and power transistor 206. Examples of such circuitry include the transmitter and the modulator discussed in FIG. 6.

Figure 5:
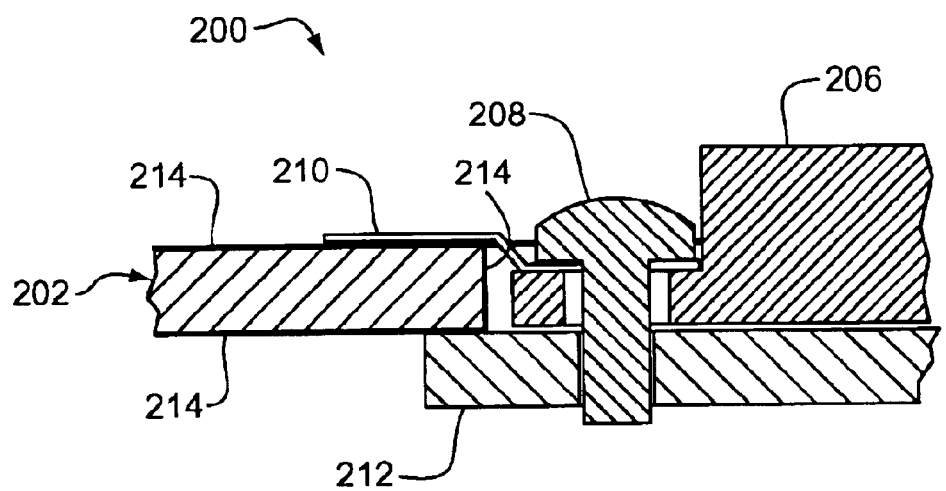
FIG. 5 shows a cross-sectional view of one circuit, in accord with one embodiment of the invention.

FIG. 5 shows a cross sectional view of circuit 200, in accord with one embodiment of the invention. Physical connector 208 is shown passing through a hole in grounding strap 210 and through a hole in a base of power transistor 206. Physical connector 208 attaches to heat sink 212. Heat sink 212 may be additionally soldered to ground plane 214. The connection of physical connector 208 to heat sink 212 completes a connection of power transistor 206 to ground plane 214 such that ground plane 214 supplies a ground reference potential to power transistor 206. Power transistor 206 may, in turn, provide power to a transmitter of printed circuit board 202. Ground plane 214 may additionally provide a ground reference potential to circuitry of printed circuit board 202 and power transistor 206. Examples of such circuitry include the transmitter and the modulator discussed in FIG. 6.

Figure 6:
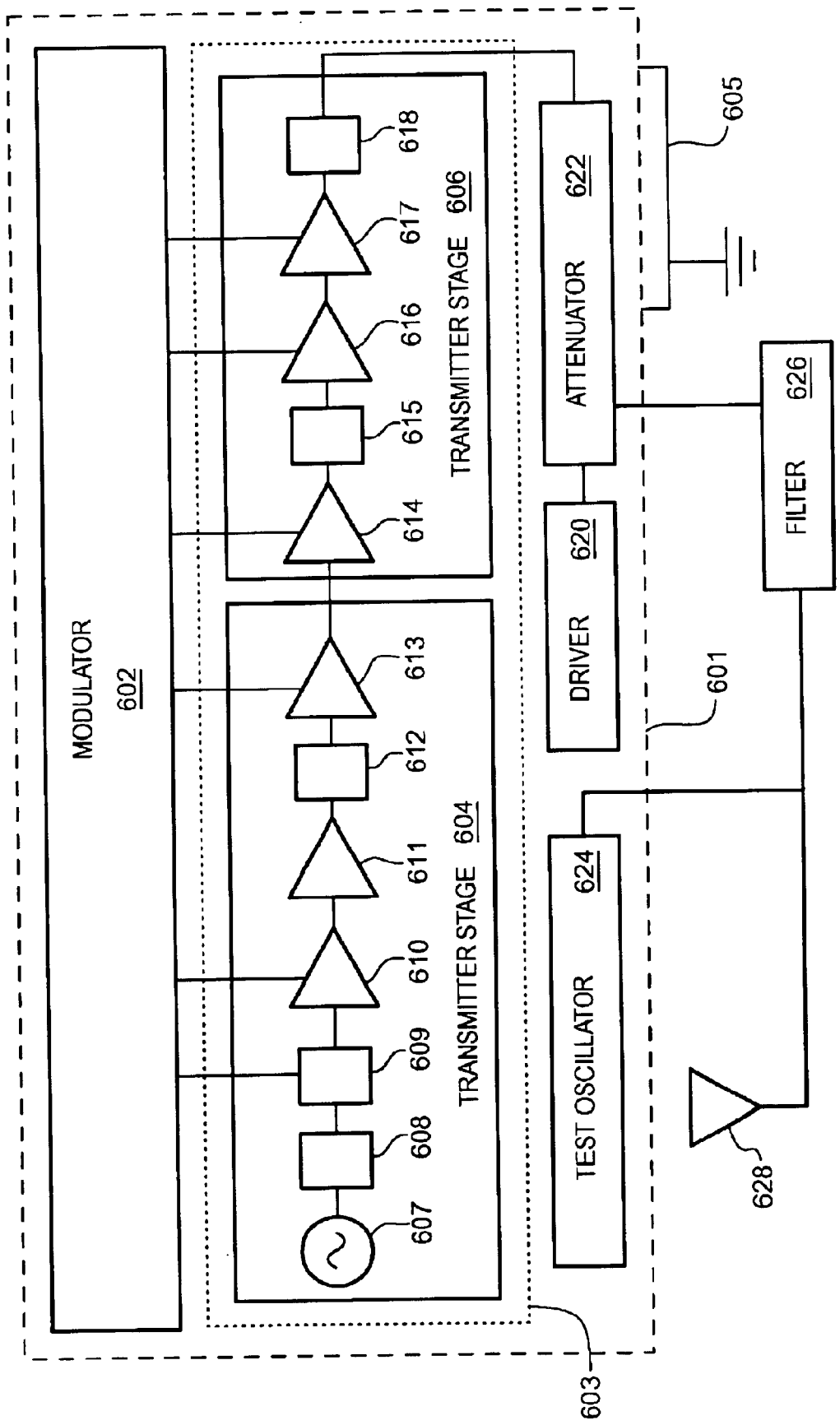
FIG. 6 shows a block diagram of one other circuit, in accord with one embodiment of the invention.

FIG. 6 shows a block diagram of circuit 601 in accord with one embodiment of the invention. Circuit 601 may be a single multi-plane printed circuit board configured for transmitting a signal through antenna 628. The signal may be filtered by band reject filter 626 prior to transmission of the signal. Circuit 601 may include modulator 602, transmitter 603, test oscillator 624, attenuator 622, and driver 620. In one embodiment: modulator 602 is electrically connected to transmitter 603 through a plurality of connections; transmitter 603 is electrically connected to attenuator 622; driver 620 is electrically connected to attenuator 622; attenuator 622 is connected to band reject filter 626; band reject filter 626 is connected to antenna 628; and test oscillator 624 is also connected to antenna 628. Circuit 601 may also include ground plane 605 electrically connected to each of modulator 602, transmitter 603, test oscillator 624, attenuator 622, and driver 620 through circuit 601.

Modulator 602, transmitter 603, test oscillator 624, attenuator 622, and driver 620 may be constructed on a single multi-plane printed circuit board. For example, modulator 602, transmitter 603, test oscillator 624, attenuator 622, and driver 620 may each be operatively coupled to individual planes of circuit 601. Ground plane 605 may be operatively coupled to circuit 601 as one or more planes of circuit 601 to provide a suitable ground reference potential for each of modulator 602, transmitter 603, test oscillator 624, attenuator 622, and driver 620. The ground reference potential increases frequency stability of the transmitted signal by decreasing external inductance to components of transmitter 603. Ground plane 605 may provide a ground reference potential to the components of transmitter 603, which can improve a gain of the transmitted signal. Since each of modulator 602, transmitter 603, test oscillator 624, attenuator 622, and driver 620 may be operatively coupled to individual planes of circuit 601, electrically connecting to ground plane 605 may be performed through "vias" that traverse through circuit 601. Connections to ground plane 605 may be similar to connections to ground plane 214 of FIGS. 2-5.

In one embodiment of the invention, transmitter 603 may include transmitter low-power stage 604 and transmitter high-power stage 606. Transmitter low-power stage 604 may include synthesizer 607, attenuator 608, diode switch 609, low-power amplifier 610, low-power amplifier 611, attenuator 612, and medium-power amplifier 613. In this embodiment: synthesizer 607 is electrically connected attenuator 608; attenuator 608 is electrically connected to diode switch 609; diode switch 609 is electrically connected to low-power amplifier 610; low-power amplifier 610 is electrically connected to low-power amplifier 611; low-power amplifier 611 is electrically connected to attenuator 612; and attenuator 612 is electrically connected to medium-power amplifier 613. In one embodiment of the invention, modulator 602 may be electrically connected to diode switch 609, low-power amplifier 610, and medium-power amplifier 613.

In one embodiment of the invention, transmitter high-power stage 606 may include medium-power amplifier 614, band pass filter 615, high-power amplifier 616, final power amplifier 617, and low pass filter 618. In this embodiment: medium-power amplifier 614 is electrically connected band pass filter 615; band pass filter 615 is electrically connected to high-power amplifier 616; high-power amplifier 616 is electrically connected to final power amplifier 617; and final power amplifier 617 is electrically connected to low pass filter 618. In one embodiment of the invention, modulator 602 may be electrically connected to medium-power amplifier 614, high-power amplifier 616, and final power amplifier 617. High-power amplifier 616 and final power amplifier 617 may receive power from modulator 602. Final power amplifier 617 may be similar to power transistor 206 of FIGS. 2-5.

Since certain changes may be made in the above methods and systems without departing from the scope of the invention, it is intended that all matter contained in the above description or shown in the accompanying drawings be interpreted as illustrative and not in a limiting sense. It is also to be understood that the following claims are to cover all generic and specific features of the invention described herein, and all statements of the scope of the invention which, as a matter of language, might be said to fall there between.

What is claimed is:

1. A circuit on a printed circuit board for transmitting radio frequency (RE) signals, comprising:
   a modulator operatively coupled to the printed circuit board;
   a ground plane attached to edges and to first and second surfaces of the printed circuit board and electrically connected to the modulator;
   a power transistor operatively coupled to the printed circuit board and electrically connected to the ground plane;
   and a ground isolation barrier formed with the ground plane to prevent cross-talk between the power transistor and the modulator.

2. The circuit of claim 1, wherein the modulator electrically connects to the ground plane through a via of the printed circuit board.

3. The circuit of claim 1 further comprises a connector electrically connected to the ground plane for fastening the power transistor to the printed circuit board through a slot in the printed circuit board.

4. The circuit of claim 3, wherein the connector comprises a grounding strap attached to the connector and electrically connected to the ground plane.

5. The circuit of claim 3 further comprising a heat sink attached to the ground plane with the connector.

6. A printed circuit board that provides a ground reference potential to a modulator circuit and a power transistor on the printed circuit board wherein the modular circuit is connected to the printed circuit board, the printed circuit board comprising:
   means for applying a ground plane to edges and to first and second surfaces of the printed circuit board;
   means for grounding the modulator circuit to the ground plane;
   means for attaching the power transistor to the printed circuit board; and grounding the power transistor to the ground plane through the printed circuit board and further a ground isolation barrier formed with the second surface to prevent cross-talk between the modulation circuit and the power transistor.

7. The printed circuit board of claim 6, wherein the modulator circuit is coupled to the ground plane through a via.

8. The printed circuit board of claim 6, wherein the power transistor is fastened with a physical connector through a slot in the printed circuit board, wherein the physical connector contacts the ground plane.

9. The printed circuit board of claim 8, wherein a ground plane strap is attached to the physical connector.

10. The printed circuit board of claim 8, further comprising a heat sink attached to the ground plane with the physical connector.

11. A printed circuit board that provides a ground reference potential to a modulator circuit and a power transistor, the printed circuit board comprising:
    means for electrically connecting the modulator circuit on a printed circuit board to a ground plane;
    means for electrically connecting the power transistor to the ground plane through a slot in the printed circuit board; and
    means for forming a ground isolation barrier with the ground plane to prevent cross-talk between the modulator circuit and the power transistor.

12. The printed circuit board of claim 11, wherein the modulator circuit is coupled to the ground plane through a via in the printed circuit board.

13. The printed circuit board of claim 11, wherein the power transistor is attached to the ground plane with a physical connector through the slot in the printed circuit board, and wherein the physical connector contacts the ground plane.

14. The printed circuit board of claim 13, wherein a grounding strap is attached to the physical connector for electrically connecting to the ground plane.

15. The printed circuit board of claim 13, further comprising a heat sink attached to the ground plane with the physical connector.

* * * * *